US009128122B2

(12) United States Patent
Andberg

(10) Patent No.: US 9,128,122 B2
(45) Date of Patent: Sep. 8, 2015

(54) STIFFENER PLATE FOR A PROBECARD AND METHOD

(75) Inventor: John Andberg, Santa Cruz, CA (US)

(73) Assignee: ADVANTEST CORPORATION, Tokyo (JP)

( * ) Notice: Subject to any disclaimer, the term of this patent is extended or adjusted under 35 U.S.C. 154(b) by 132 days.

(21) Appl. No.: 13/878,070

(22) PCT Filed: Jan. 18, 2011

(86) PCT No.: PCT/US2011/021503
§ 371 (c)(1),
(2), (4) Date: Apr. 5, 2013

(87) PCT Pub. No.: WO2012/099572
PCT Pub. Date: Jul. 26, 2012

(65) Prior Publication Data
US 2013/0285690 A1 Oct. 31, 2013

(51) Int. Cl.
*G01R 1/073* (2006.01)
*G01R 31/28* (2006.01)
(52) U.S. Cl.
CPC ........ *G01R 1/07307* (2013.01); *G01R 31/2886* (2013.01)
(58) Field of Classification Search
CPC .................. G01R 1/07307; G01R 31/2886
USPC ................. 324/754.03, 755.01, 756.07
See application file for complete search history.

(56) References Cited

U.S. PATENT DOCUMENTS

| 7,274,202 | B2 | 9/2007 | Kolman |
| 2007/0145988 | A1 | 6/2007 | Garabedian et al. |
| 2007/0273398 | A1* | 11/2007 | Di Stefano et al. ........... 324/755 |
| 2008/0211525 | A1 | 9/2008 | Garabedian et al. |
| 2009/0160468 | A1 | 6/2009 | Lindsey et al. |
| 2010/0134127 | A1* | 6/2010 | Breinlinger et al. .......... 324/757 |
| 2010/0176396 | A1* | 7/2010 | Wada .............................. 257/48 |
| 2010/0244866 | A1* | 9/2010 | Lindsey et al. ............... 324/754 |

OTHER PUBLICATIONS

International Search Report and Written Opinion issued Mar. 15, 2011 in PCT/US2011/021503.

* cited by examiner

*Primary Examiner* — Arleen M Vazquez
*Assistant Examiner* — Robert P Alejnikov, Jr.
(74) *Attorney, Agent, or Firm* — Manuel de la Cerra

(57) ABSTRACT

A microelectronic contactor assembly can include a probe head having microelectronic contactors for contacting terminals of semiconductor devices to test the semiconductor devices. A stiffener assembly can provide mechanical support to microelectronic contactors and for connecting a probe card assembly to a prober machine. A stiffener assembly may include a main body and a plurality of mounting points, wherein at least one of the mounting points is flexibly connected to the main body by one or more laterally extending beams that has a section modulus normal to the lateral direction significantly greater than in the lateral direction. The stiffener assembly allows for differential thermal expansion of various components of the microelectronic contactor assembly while minimizing accompanying dimensional distortion that could interfere with contacting the terminals of semiconductor devices.

20 Claims, 8 Drawing Sheets

STIFFENER PLATE FOR A PROBECARD AND METHOD

1.0a CROSS REFERENCE TO RELATED APPLICATIONS

The present application claims priority to International Patent Application No. PCT/US2011/021503 filed Jan. 18, 2011, which application is incorporated herein fully by this reference.

1.0b BACKGROUND

Typically, semiconductor chips are tested to verify that they function appropriately and reliably. This is often done when the semiconductor chips are still in wafer form, that is, before they are diced from the wafer and packaged. This allows the simultaneous testing of many semiconductor chips in parallel, creating considerable advantages in cost and process time compared to testing individual chips once they are packaged. If chips are found to be defective, they may be discarded when the chips are diced from the wafer, and only the reliable chips need be packaged. Semiconductor chips may also be tested after dicing, but before packaging by assembling die on tape or a mechanical carrier.

Generally, modern microfabricated (termed MEMS) microelectronic contactor assemblies, including probe card assemblies for testing semiconductors, have at least three components: a printed circuit board (PCB), a substrate to which thousands of microelectronic contactors are coupled (which substrate may be referred to as the "probe contactor substrate"), and a compressible electrical interconnect (often in the form of an electrical "interposer"). The compressible electrical interconnect electrically connects the individual electrical contacts of the PCB to corresponding electrical contacts on the probe contactor substrate, which probe contactor substrate then relays signals to individual microelectronic contactors. The combination of the probe contactor substrate and its microelectronic contactors is sometimes referred to as a probe head.

The microelectronic contactors on the probe contactor substrate often have a very fine pitch (i.e., small distances between contactors, such as 30 µm to 200 µm) while the electrical contacts of the PCB and the interposer often have coarser pitches (>200 µm). Thus, in modern MEMS probe card assemblies, the probe contactor substrate often provides a space transformation of electrical contracts as it connects the finely pitched microelectronic contactors to the coarser pitched electrical contacts found on the interposer and PCB. Alternately, part or all of this space transformation may be off-loaded to a separate space transformer substrate of the probe head, or to other substrates or components. It is noted that some probe card assemblies do not utilize an interposer, but the general idea is unchanged.

In most applications, the required number of interconnects that need to be made between the substrates of a probe card assembly are in the thousands or tens of thousands, dictating that the PCB and the probe head be parallel (or very close to parallel), and in close proximity, so that the many interconnects therebetween can be reliably made. It is also noted that the vertical space between the PCB and the probe contactor substrate is generally constrained to only a few millimeters.

So that reliable connections to a wafer or other array of semiconductor devices can also be made, it is also important that the tips of the microelectronic contactors on the probe head lie essentially in a plane, such as a horizontal or laterally extending plane. U.S. Pat. No. 7,180,316, titled "Probe Head with Machined Mounting Pads and Method of Forming Same," discusses the importance of the planarity of the microelectronic contactor tips (or probe tips), and is hereby incorporated herein by reference in its entirety.

It is often advantageous to test semiconductor chips to verify that they function appropriately and reliably at specific temperatures or over a range of temperatures. But exposing the various components of the probe head to varying temperatures during testing can cause dimensional changes that interfere with the planarity of the tips of the microelectronic contactors, which tends to impair the reliability of the connections to the wafer. One attempt to address this issue was described in U.S. Pat. No. 7,592,821, titled "Apparatus and Method for Managing Thermally Induced Motion of a Probe Card Assembly," which patent is hereby incorporated herein by reference in its entirety. As shown in that patent and reproduced here for convenience, FIG. 1A illustrates an exemplary prior art probing system used to test dies (not shown) on a newly manufactured semiconductor wafer 112 or other electronic devices. The probing system of FIG. 1A includes a test head 104 and a prober 102 (which is shown with a cut-away 126 to provide a partial view of the inside of the prober 102). To test the dies (not shown) of the semiconductor wafer 112, the wafer 112 is placed on a moveable stage 106 as shown in FIG. 1A, and the stage 106 is moved such that terminals (not shown) on dies (not shown) of the wafer 112 are brought into contact with probes 124 of a probe card assembly 108. Temporary electrical connections are thus established between the probes 124 and dies (not shown) of the wafer 112 to be tested.

Typically, a cable 110 or other communication means connects a tester (not shown) with the test head 104. Electrical connectors 114 may electrically connect the test head 104 with the probe card assembly 108. The probe card assembly 108 shown in FIG. 1A includes a wiring board 120, which can provide electrical connections from connectors 114 to the probe substrate 122, and the probe substrate 122 can provide electrical connections to the probes 124.

The cable 110, test head 104, and electrical connectors 114 thus provide electrical paths between the tester (not shown) and the probe card assembly 108, and the probe card assembly 108 extends those electrical paths to the probes 124. Thus, while the probes 124 are in contact with the terminals (not shown) of the dies (not shown) on the wafer 112, cable 110, test head 104, electrical connectors 114, and probe card assembly 108 provide a plurality of electrical paths between the tester (not shown) and the dies (not shown). The tester (not shown) writes test data through these electrical paths to the dies (not shown), and response data generated by the dies (not shown) in response to the test data is returned to the tester (not shown) through these electrical paths.

To test the dies (not shown) of the wafer 112 at specific temperatures or over a range of temperatures, heating elements or cooling elements (not shown) may be included in the stage 106 or at other locations in the prober 102 to heat or cool the wafer 112 during testing. Even if heating elements or cooling elements (not shown) are not used, operation of the dies (not shown) of the wafer 112 may generate heat. Such heating or cooling from either heating/cooling elements (not shown) or from operation of the dies (not shown) may cause the wafer 112 and the probe substrate 122 to expand or contract, changing the positions of the probes 124 and the terminals (not shown) on the wafer 112, which may cause misalignment between the probes 124 and terminals (not shown) in a laterally extending plane, such as the generally horizontal "x, y" plane indicated in FIG. 1A. If such "x, y" misalignment becomes too great, the probes 124 will no longer be able to contact all of the terminals (not shown). (This horizontal plane is in the directions labeled "x, y" in FIG. 1A and will hereinafter be referred to as "x, y" movement. In FIG. 1A, the direction labeled "x" is horizontal across the page, the direction labeled "y" is horizontal into and out of the page, and the direction labeled "z" is vertical, i.e, normal to the laterally extending x, y plane. These orientation of these planes is an example provided for convenience and is not to be taken as limiting. For instance, the entire structure shown in FIG. 1A could be rotated 90 degrees, or some other orientation.)

The use of heating elements or cooling elements (not shown) to heat or cool the wafer 112 during testing, and/or the generation of heat by the dies of the wafer 112 as they are tested, may also cause a thermal gradient between the side of the probe card assembly 108 that faces the wafer 112 (hereinafter a side of the probe card assembly that faces the wafer 112 will be referred to as the "front-side" or the "wafer-side") and the opposite side of the probe card assembly (hereinafter the opposite side of the probe card assembly will be referred to as the "back-side" or the "tester side"). Such thermal gradients can cause the probe card assembly 108 to bow or warp. If such bowing is towards the wafer 112, the probe card assembly 108 may press against the wafer 112 with too much force and damage the wafer 112 or probe card assembly 108. If such bowing is away from the wafer 112, some or all of the probes 124 may move (in a generally vertical direction with respect to FIG. 1A) out of contact with the terminals (not shown) on the wafer 112. If the probes 124 do not contact the terminals (not shown), the dies (not shown) on the wafer 112 will falsely test as failed. (Movement to or away from the wafer 112 is labeled the "z" direction in FIG. 1A and will hereinafter be referred to as "z" movement, i.e, movement normal to the lateral ("x, y") direction.)

Typically, the probe substrate 122 is attached directly to the wiring board 120, which in turn is attached to a test head plate 121 on the prober 102. A shown in FIG. 1B, the test head plate 121 forms an opening 132 in the prober 102 into which the probe substrate 122 fits (as generally shown in FIG. 1A). The test head plate 121 may include holes 134 for bolts that secure the probe card assembly 108 to the test head plate 121. (Clamping or techniques other than bolting may be used to attached the probe card assembly 108 to the test head plate 121.) The wiring board 120 is typically made of a printed circuit board material, which is particularly susceptible to thermally induced "x, y" and "z" movements.

In view of these issues, U.S. Pat. No. 7,592,821 described an approach to counteracting thermally induced movements of a probe card assembly. As generally described with respect to FIGS. 2A-3B and FIGS. 6-7B in that patent, a system was discussed where a probe card was backed by a wiring substrate (e.g., printed circuit board), all backed by a stiffener plate that could itself be further backed by a reinforcing truss structure. When the probe card was used for temperature testing and faced heated semiconductor chips, the probe card and adjacent wiring substrate would be exposed to more heat than the more distant and shielded stiffener plate, which itself was exposed to more heat than the still more distant and further shielded reinforcing truss. A thermal gradient was thus created from the front "probe card" side to the back "reinforcing truss" side of the probe card assembly.

U.S. Pat. No. 7,592,821 taught selecting materials for the probe head assembly, stiffener plate, and truss structure so that each expands or contracts by the same amount when exposed to the different amounts of heat. That is, the probe head assembly was urged to be made of a material with a low coefficient of thermal expansion such that it expands approximately a specified distance "d" in response to its expected temperature in the temperature gradient. The stiffener plate, which would be at a lower temperature than the probe head assembly, was taught to be made of a material with a higher coefficient of thermal expansion so that it also expands the same specified distance "d" in response to its (lower) expected temperature in the temperature gradient. And the truss structure, which would be at an even lower temperature than the stiffener plate, was suggested to be made of a material with an even higher coefficient of thermal expansion so that it also expands the same specified distance "d" in response to its (even lower) expected temperature in the temperature gradient.

In practice, however, the exact temperature gradient usually cannot be known, especially ahead of time, and there are a limited number of materials available for use as the various components (i.e., there is a limited choice of coefficients of thermal expansion), so the probe card assembly described in U.S. Pat. No. 7,592,821 is still prone to thermally induced "x, y" and "z" movements, including deformation, bending, warping, etc., due to differential expansion at various temperatures of different materials that are mechanically constrained or fused together. Improved techniques for minimizing thermally induced movements of a probe card assembly are thus desirable, as well as improved techniques for dealing with any such movements that do occur.

2.0 SUMMARY

The following summary is provided to show examples of the invention and not to define or otherwise limit the scope of the invention. Provided is an example laterally extending stiffener plate adapted to provide stiffening for a probecard in a microelectronic contactor assembly, comprising a main body and a plurality of mounting points, wherein at least one of the mounting points is flexibly connected to the main body by one or more laterally extending beams that has a section modulus normal to the lateral direction at least sixteen times greater than in the lateral direction. In various example embodiments, the one or more laterally extending beams may have a section modulus normal to the lateral direction at least twenty-five times, thirty-six times, forty-nine times, sixty-four times, eighty-one times, or one-hundred times greater than in the lateral direction.

Also provided is an example microelectronic contactor assembly, comprising a probe head comprising a plurality of microelectronic contactors for contacting terminals of semiconductor devices to test the semiconductor devices, the plurality of microelectronic contactors being attached to a probe head, a laterally extending stiffener for providing mechanical support to the microelectronic contactors and for connecting the probe card assembly to a prober machine, the stiffener comprising a main body and a plurality of mounting points, wherein at least one of the mounting points is flexibly connected to the main body by one or more laterally extending beams that has a section modulus normal to the lateral direction at least sixteen times greater than in the lateral direction, the probe head being attached to the main body of the stiffener, and the stiffener being adapted to be attached to the prober machine at the mounting points. In various example embodiments, the microelectronic contactor assembly may further comprise a circuit board disposed between the probe head and the stiffener, and/or a compressible electrical interconnect disposed between the probe head and the circuit board, the compressible electrical interconnect providing electrical interconnections between the probe head and the circuit board. In various example embodiments, the one or more laterally extending beams may have a section modulus normal to the lateral direction at least twenty-five times, thirty-six times, forty-nine times, sixty-four times, eighty-one times, or one-hundred times greater than in the lateral direction.

Further provided is an example method of maintaining contact between a plurality of microelectronic contactors and terminals of semiconductor devices, the method comprising the step of coupling a probe card assembly to a prober machine for testing semiconductor devices, the probe card assembly comprising a plurality of microelectronic contactors for contacting terminals of semiconductor devices to test the semiconductor devices, the plurality of microelectronic contactors being attached to a probe head, a laterally extending stiffener for providing mechanical support to the microelectronic contactors and for connecting the probe card assembly to a prober machine, the stiffener comprising a main body and a plurality of mounting points, wherein at least one of the mounting points is flexibly connected to the main body by one or more laterally extending beams that has a section modulus normal to the lateral direction at least sixteen times greater than in the lateral direction, the probe head being attached to the main body of the stiffener and the stiffener being attached to the prober machine at the mounting points, the method further comprising the step of causing the probe head and the main body of the stiffener to which the probe head is attached to laterally expand or contract thermally relative to the mounting points, so that the ones of the probes and the ones of the terminals of the semiconductor devices maintain sufficient alignment to maintain said contact as the semiconductor devices expand or contract thermally. In various example embodiments, the one or more laterally extending beams may have a section modulus normal to the lateral direction at least twenty-five times, thirty-six times, forty-nine times, sixty-four times, eighty-one times, or one-hundred times greater than in the lateral direction.

3.0 BRIEF DESCRIPTION OF THE DRAWINGS

Figure 3:
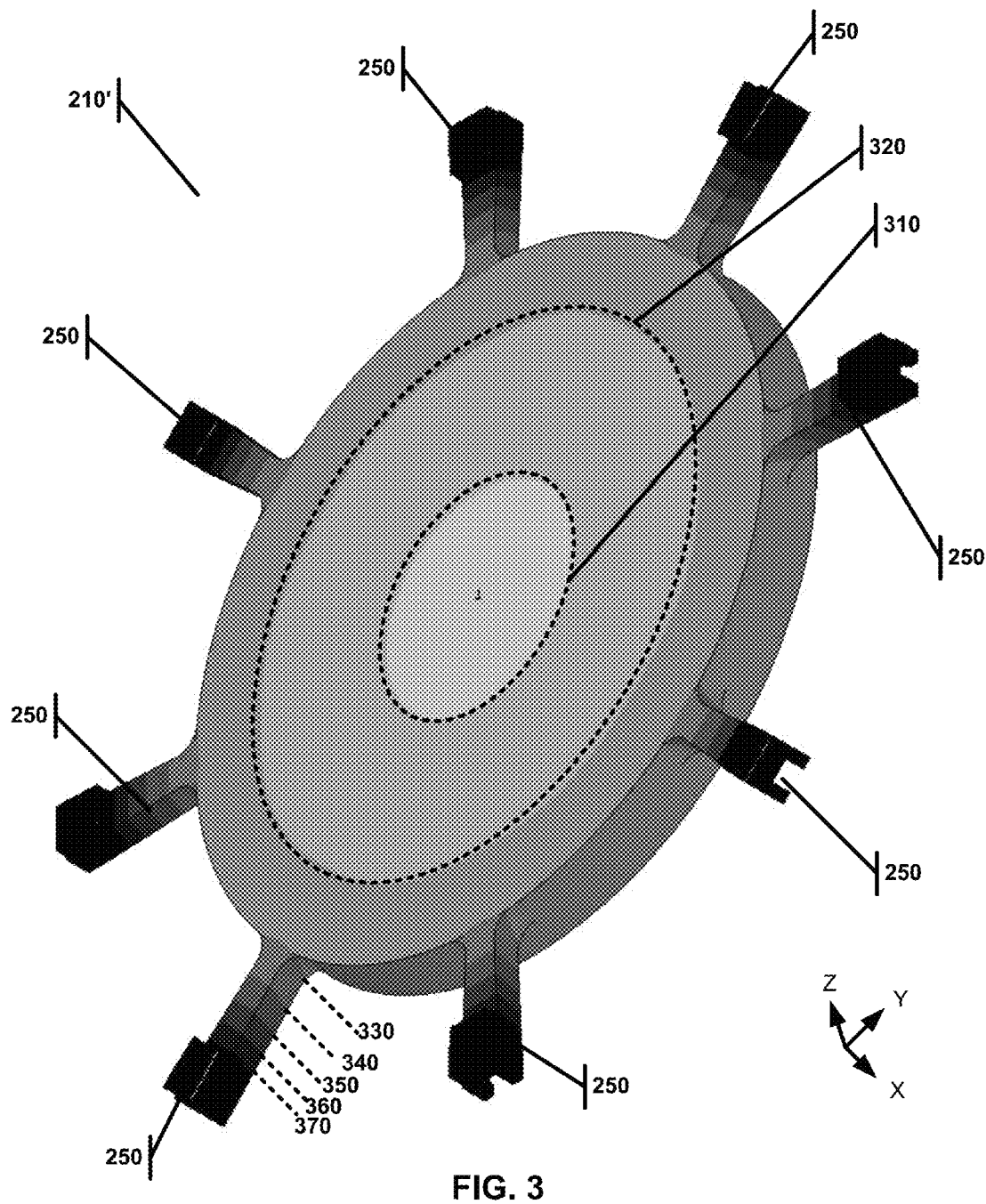
FIG. 3 shows a bottom perspective view of an example laterally extending stiffener plate with shading depicting thermally induced deflection in the "z" direction, normal to the lateral "x, y" direction, during use. The lighter the shading, the greater the deflection.
Figure 7:
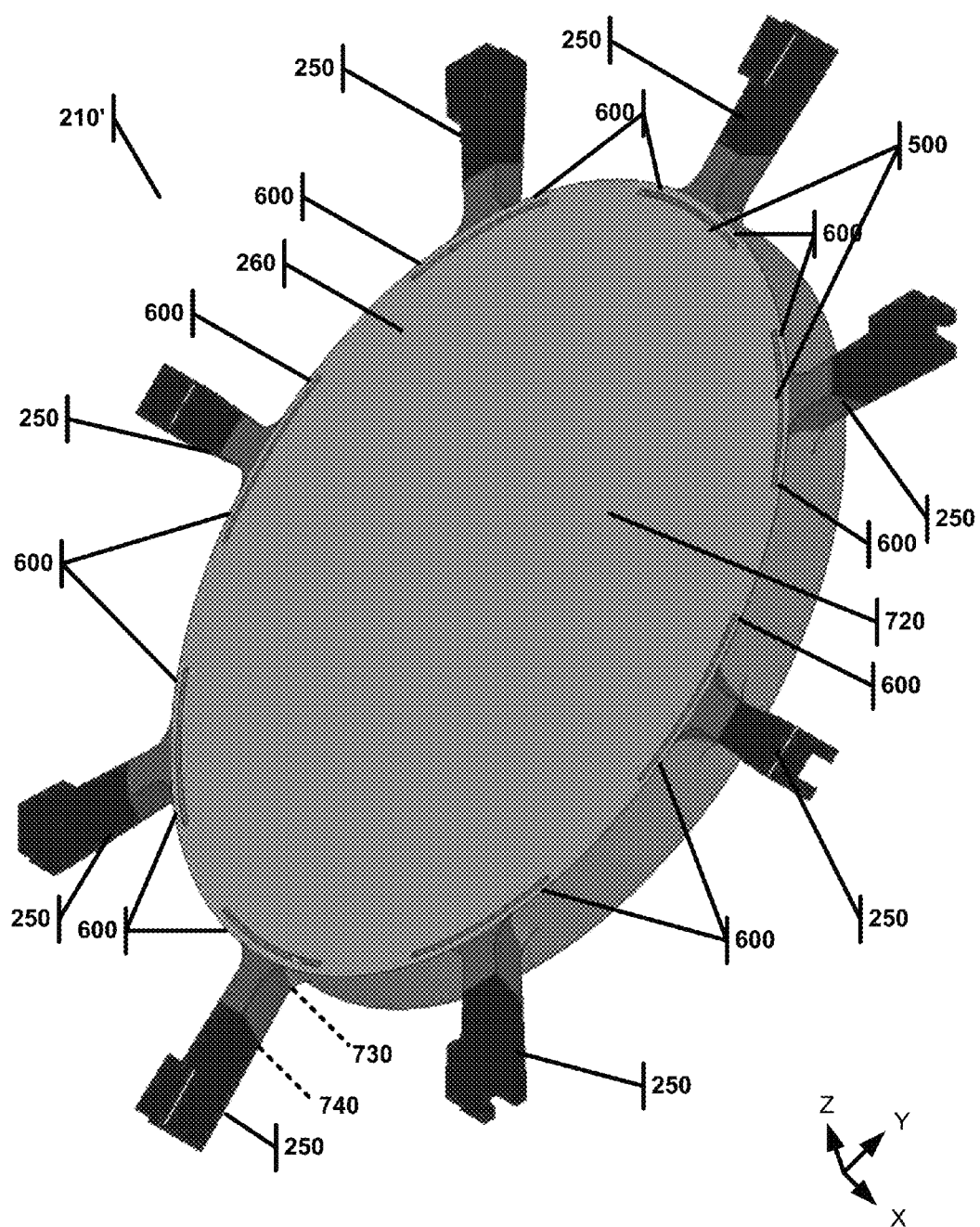

FIG. 7 shows a bottom perspective view of the laterally extending stiffener plate of FIG. 3, modified according to one example embodiment of the present invention to include laterally extending beams connecting the mounting points to the main body of the stiffener plate, with shading depicting thermally induced deflection in the "z" direction, normal to the lateral "x, y" direction, during use. The lighter the shading, the greater the deflection.

Figure 4:
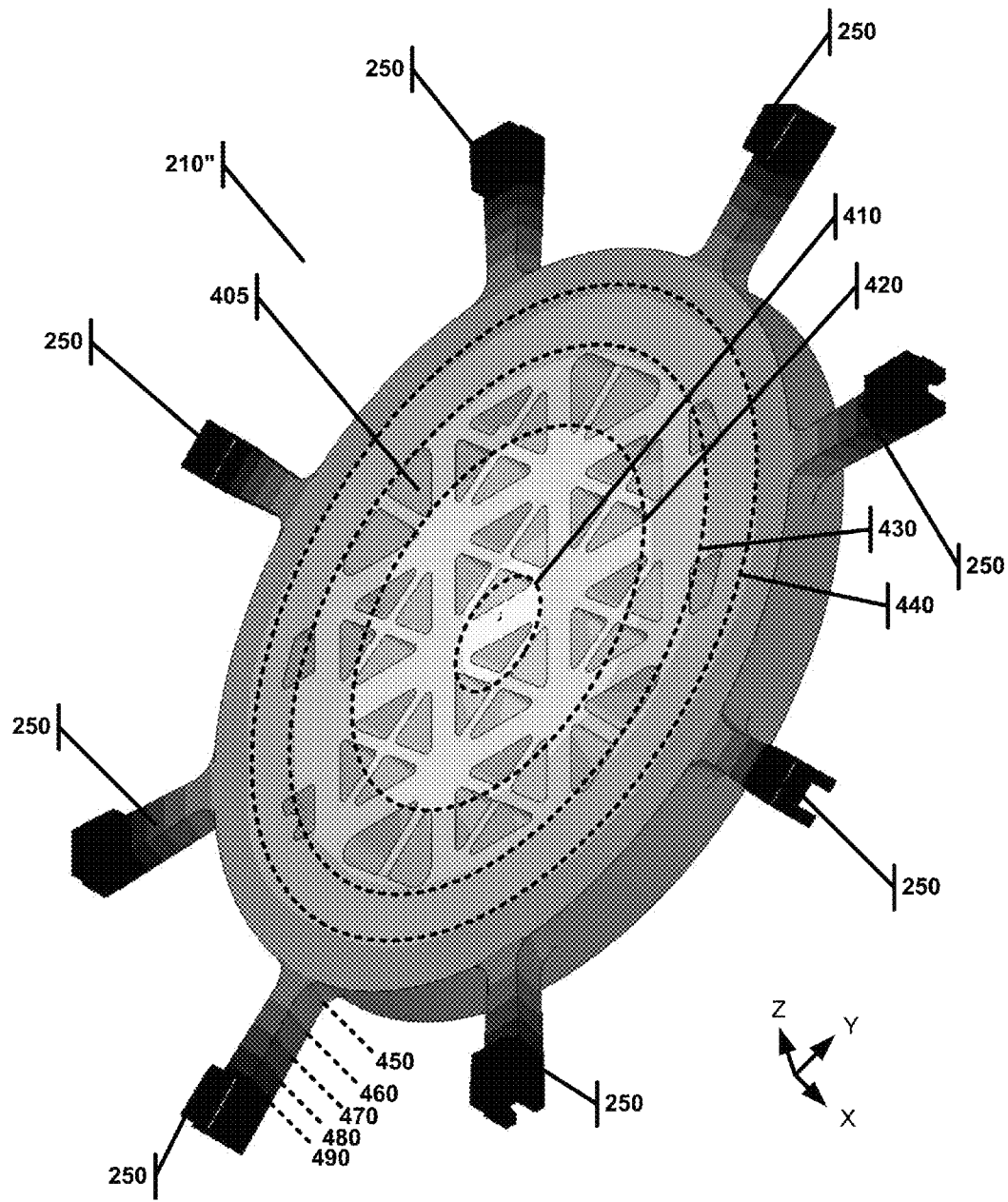
FIG. 4 shows a bottom perspective view of an example laterally extending stiffener plate with shading depicting thermally induced deflection in the "z" direction, normal to the lateral "x, y" direction, during use. The lighter the shading, the greater the deflection.
Figure 8:
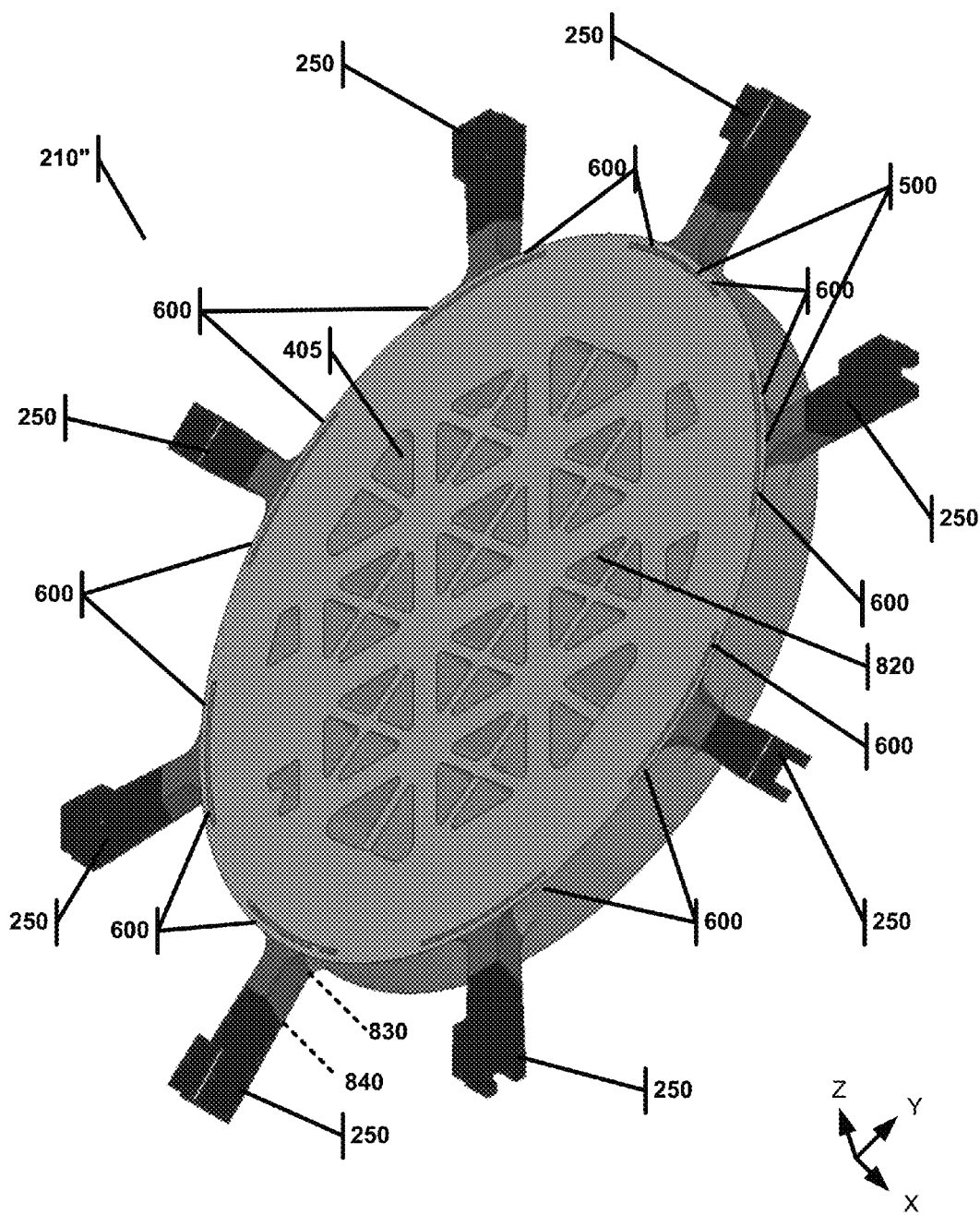

FIG. 8 shows a bottom perspective view of the laterally extending stiffener plate of FIG. 4, modified according to one example embodiment of the present invention to include laterally extending beams connecting the mounting points to the main body of the stiffener plate, with shading depicting thermally induced deflection in the "z" direction, normal to the lateral "x, y" direction, during use. The lighter the shading, the greater the deflection.

It is noted that, in the following description, like reference numbers appearing in different drawing figures refer to like elements/features. Often, therefore, like elements and features that appear in different drawing figures will not be described in detail with respect to each of the drawing figures.

4.0 DETAILED DESCRIPTION

This specification describes exemplary embodiments and applications of the invention. The invention, however, is not limited to these exemplary embodiments and applications or to the manner in which the exemplary embodiments and applications operate or are described herein.

Exemplary Microelectronic Contactor Assemblies, or "Probe Cards"

Figure 1A:
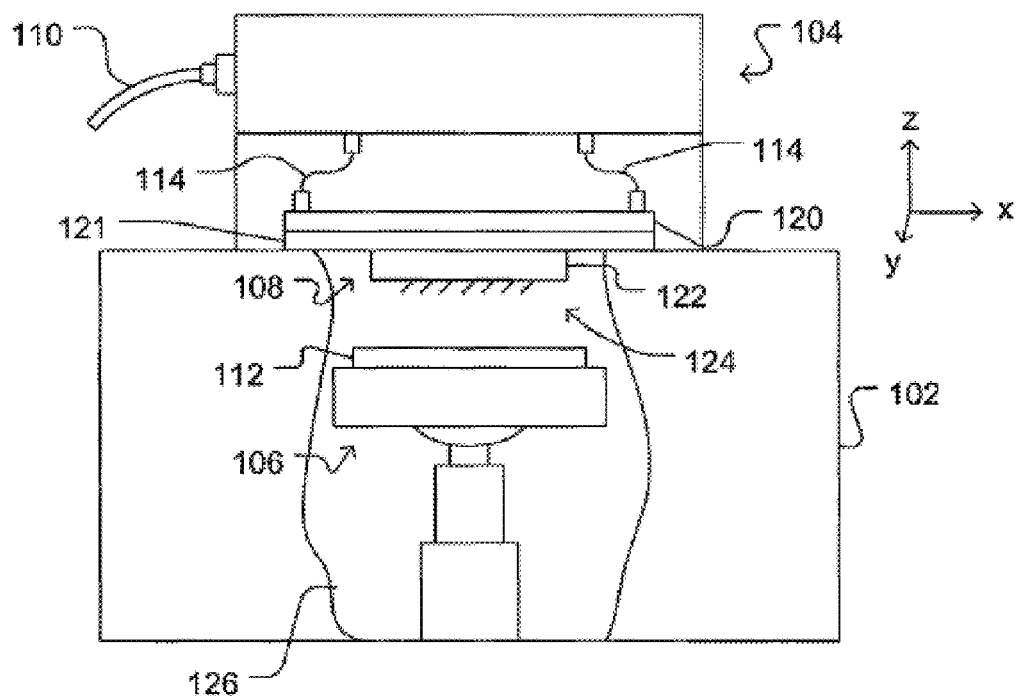
FIG. 1A shows a side view of an exemplary prior art prober, test head, and probe card assembly. A cut-out provides a partial view of the inside of the prober.
Figure 1B:
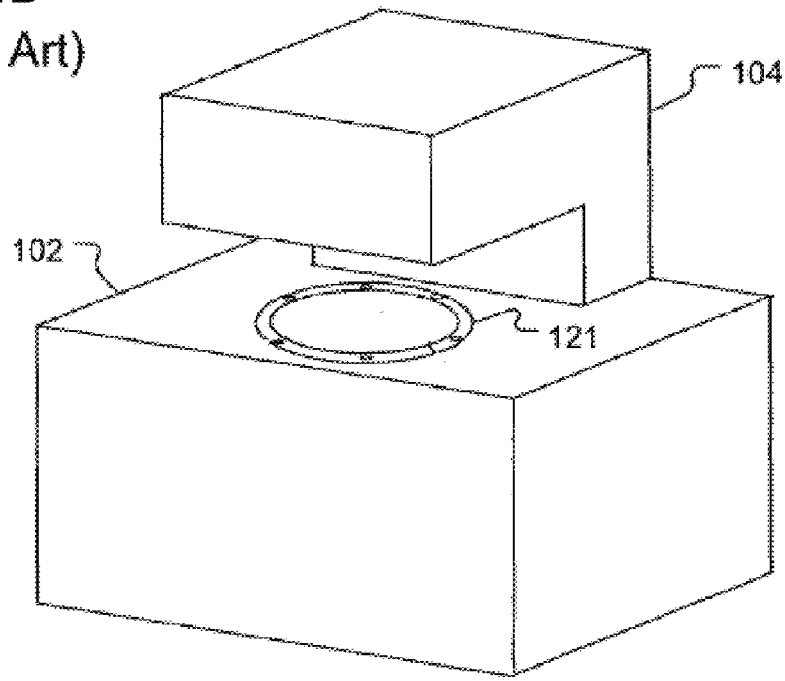
FIG. 1B shows a perspective view of the prober and test head of FIG. 1A without a probe card assembly.
Figure 2:
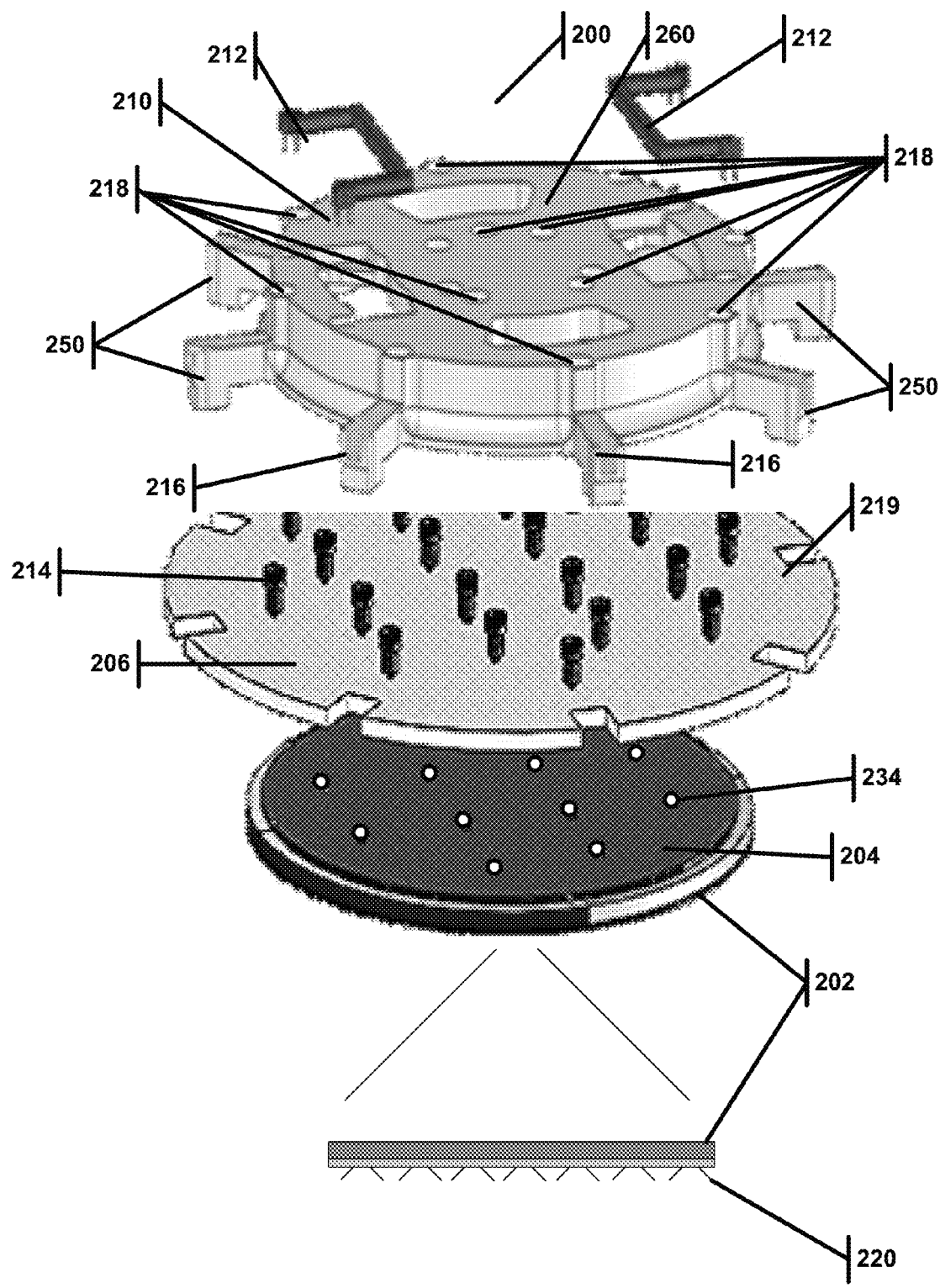
FIG. 2 shows an exploded view of the principal components of an exemplary probe card assembly that can be used with some embodiments of the invention.

FIG. 2 is an exploded assembly view of an example probe card assembly 200. (In FIG. 2 the "x" direction is horizontal across the page, the "y" direction, although shown slightly askew, is perpendicular—that is, into and out of—the page, and the "z" direction is vertical—that is, up and down—on the page. These directions are provided for purposes of illustration and discussion only, however, and are not limiting.) Although not limited to use with the prober 102 and test head 104 of FIGS. 1A and 1B, the exemplary probe card assembly 200 may be used in a prober 102 and test head 104 like that of FIGS. 1A and 1B in place of probe card assembly 108.

The exemplary probe card or microelectronic contactor assembly 200 shown in FIG. 2 may in some cases be configured as a microelectronic wafer contactor assembly or probe card assembly (i.e., an assembly for contacting semiconductor devices on a wafer or die). The dies (not shown) to be tested can be dies of an unsingulated semiconductor wafer (e.g., like wafer 112 of FIG. 1A), singulated dies (e.g., held in a carrier (not shown)), dies forming a multi-chip module, or any other arrangement of dies to be tested. As described herein, a wiring substrate 206 can provide electrical connections to the probe head assembly 202, and a stiffener plate 210 provides mechanical and dimensional stability to the probe head assembly 202 and circuit board 206.

With reference to FIG. 2, the example assembly 200 may comprise a probe head 202, a compressible electrical interconnect 204, a circuit board 206, a laterally extending stiffener plate 210, handles 212 attached to the stiffener 210, a plurality of adjustable multi-part fasteners 214 connecting the probe head 202, electrical interconnect 204, and circuit board 206 to the stiffener 210. The circuit board 206 may be disposed between the probe head 202 and the stiffener 210, and the compressible electrical interconnect 204 may be disposed between the probe head 202 and the circuit board 206.

As shown in FIG. 2, the probe head 202 may have a plurality of microelectronic contactors, or probes, 220. These probes 220 may be electrically connected to the circuit board 206, at least in part, by electrical connections that the compressible electrical interconnect 204 may provide between the probe head 202 and the circuit board 206. Probes 220 (or any of the probes discussed herein) can be resilient, conductive structures. Non-limiting examples of suitable probes 220 include composite structures formed of a core wire bonded to a conductive terminal (not shown) on a probe head assembly (e.g., like probe head 202) that is over coated with a resilient material as described in U.S. Pat. Nos. 5,476,211, 5,917,707, and 6,336,269, all of which are incorporated herein by reference. Probes 220 may alternatively be lithographically formed structures, such as the spring elements disclosed in U.S. Pat. Nos. 5,994,152, 6,033,935, 6,255,126, 6,945,827, U.S. Patent Application Publication No. 2001/0044225, and U.S. Patent Application Publication No. 2004/0016119, all of which are incorporated herein by reference. Still other non-limiting examples of probes 220 are disclosed in U.S. Pat. Nos. 6,827,584, 6,640,432, U.S. Pat. No. 6,441,315, and U.S. Patent Application Publication No. 2001/0012739, all of which are incorporated herein by reference. Other non-limiting examples of probes 220 include conductive pogo pins, bumps, studs, stamped springs, needles, buckling beams, etc.

In use, electrical signals may be transmitted between one or more devices connected to the microelectronic contactors 220 and equipment connected to the circuit board 206. By way of example, the circuit board 206 may be provided with electrical contacts or connectors (not shown) for electrically connecting the circuit board 206 to other equipment. In some embodiments, the device(s) connected to the microelectronic contactors 220 may be semiconductor devices under test (DUTs), such as semiconductor chips on a wafer, and the equipment to which the circuit board 206 is connected may be test equipment such as automated test equipment (ATE).

In the example shown, mechanical fasteners 214 may comprise any suitable means for securing the probe head assembly 202 to the stiffener plate 210. For example, the mechanical fasteners 21 may be as simple as screws or bolts that engage threaded holes 218 in the stiffener plate 210 and threaded holes 234 in the probe head assembly 202. Alternatively, the holes 218 may be clearance holes in the stiffener 210 that do not engage the fasteners 214, but rather provide access to the fasteners 214. In various embodiments the mechanical fasteners 214 may be more complicated structures that provide additional functions, for instance to control the orientation of the probe head assembly 202 (and thus the probes 220) with respect to the stiffener plate 210. Mechanical fasteners 214 may also comprise adjustment mechanisms (not shown), such as tilt-adjusting differential screws. The probe head 202 may include a plurality of inserts (not shown) anchored therein. As used herein, the term "insert" refers to a device that is anchored in another device (e.g., a probe head 202) by extending into a hole or recess in the other device. Example inserts, differential screw assemblies, and applications thereof applicable to the present disclosure are described more fully in application Ser. Nos. 12/709,268 and 12/756,578 filed on Feb. 19, 2010 and Apr. 8, 2010 respectively, the entire disclosures of which are incorporated herein by reference. By way of reference, in one example embodiment the total thickness of the probecard assembly 200 may be approximately 20 millimeters.

Thermal Effects on Stiffener Plates

FIGS. 3-4 illustrate exemplary laterally extending stiffener plates 210', 210", with shading depicting thermally induced deflection in the "z" direction, normal to the lateral "x, y" direction, during use. FIG. 3 shows a solid stiffening plate 210', while FIG. 4 shows a stiffening plate 210" with holes 405 formed therethrough to reduce its weight and thermal mass. Generally, the lighter the shading of an area of the stiffener plates 210', 210", the greater the indicated "z" deflection of that area during use, as part of a microelectronic contactor assembly 200 (i.e., probe card 200) when used to thermally test semiconductor chip wafers in a prober 102 (FIG. 1B). The "z" deflection tends to be greatest in the central portions 310, 410 of the stiffener plates 210', 210", and least at the mounting points 250, because the mounting points 250 are rigidly fastened to a relatively dimensionally stable member, such as a test head plate 121 on a prober 102 (FIG. 1B) (via, for instance, fasteners (not shown) passing through holes 216 (FIGS. 2, 5A, 5B) in mounting points 250 and engaging threaded holes 134 in the test head plate 121), while the stiffener plate 210', 210" is subjected to heat or cold and experiences resulting thermal expansion or contraction, causing bowing or warpage in the "z" direction. In other words, the stiffener plate 210', 210" wants to expand or contract in reaction to being heated or cooled by the testing processes occurring inside the prober 102, but the relatively stable (dimensionally and in temperature) exterior of the prober 102 and test head plate 121 are rigidly fastened to the stiffener plate 210', 210" at the mounting points 250, preventing the stiffener plate 210', 210" from expanding or contracting at the mounting points 250. Since the stiffener plate 210', 210" must nonetheless expand or contract when heated or cooled, it does so by creating a bow or warpage in the "z" direction that tends to be greatest near the central portions 310, 410 of the stiffener plate 210', 210" and least at the rigidly restrained mounting points 250. If such bowing is towards the wafer 112, the probe card assembly 108 may press against the wafer 112 with too much force and damage the wafer 112 or probe card assembly 108. If such bowing causes the probes 124 to move away from the wafer 112, some or all of the probes 124 may move out of contact with the terminals (not shown) on the wafer 112. If the probes 124 do not contact the terminals (not shown), the dies (not shown) on the wafer 112 will falsely test as failed.

For example, in one embodiment, a stiffener plate 210' was computer modeled as 304 Stainless Steel, with a temperature increase of 60 degrees Celsius, while rigidly restraining the mounting points 250. In the central region identified generally by dashed line 310, the largest "z" deflection was about 2.4 e-4 meters. The predicted "z" deflection under these conditions decreased as measurements were taken increasingly closer to the rigidly fixed mounting points 250, with dashed line 320 representing a "z" deflection of about 1.8 e-4 meters, and lines 330, 340, 350, 360 and 370 indicating areas having "z" deflections of 1.5 e-4, 1.2 e-4, 9.0 e-5, 6.0 e-5 and 3.0 e-5 meters, respectively.

In another example, a stiffener plate 210" was computer modeled as 304 Stainless Steel, with a temperature increase of 60 degrees Celsius, while rigidly restraining the mounting points 250. In the central region identified generally by dashed line 410, the largest "z" deflection was about 2.7 e-4 meters. The predicted "z" deflection under these conditions decreased as measurements were taken increasingly closer to the rigidly fixed mounting points 250, with dashed line 420 representing a "z" deflection of about 2.4 e-4 meters, and lines 430, 440, 450, 460, 470, 480 and 490 indicating areas having "z" deflections of 2.1 e-4, 1.8 e-4, 1.5 e-4, 1.2 e-5, 9.0 e-5, 6.0 e-5 and 3.0 e-5 meters, respectively.

The magnitudes of these predicted thermally-induced "z" deflections are significant. For example, the maximum "z" deflection of stiffener plate 210' due to the mechanical force of performing the probing operation was estimated to be only about 2.9 e-6 meters, magnitudes less than the maximum predicted deflections due to thermal effects.

Exemplary Improved Stiffener Plates

Figure 5A:
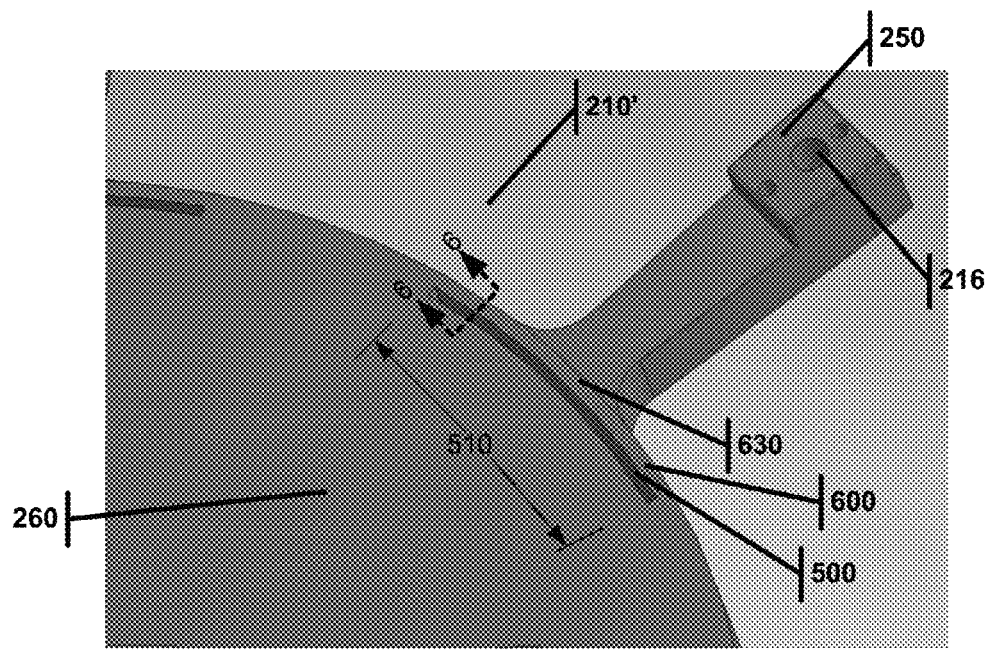
FIG. 5A shows a portion of the laterally extending stiffener plate of FIG. 3, modified according to one example embodiment of the present invention to include laterally extending beams connecting a mounting point to the main body of the stiffener plate.
Figure 5B:
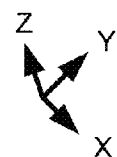
FIG. 5B shows a portion of the laterally extending stiffener plate of FIG. 4, modified according to one example embodiment of the present invention to include laterally extending beams connecting a mounting point to the main body of the stiffener plate.
Figure 5B:
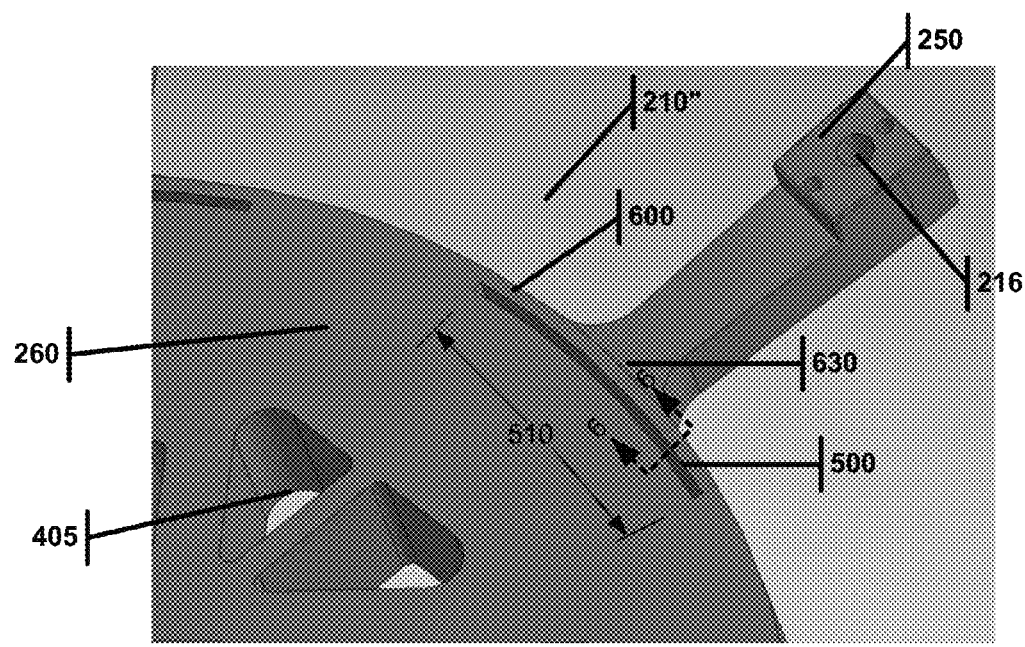
Figure 6:
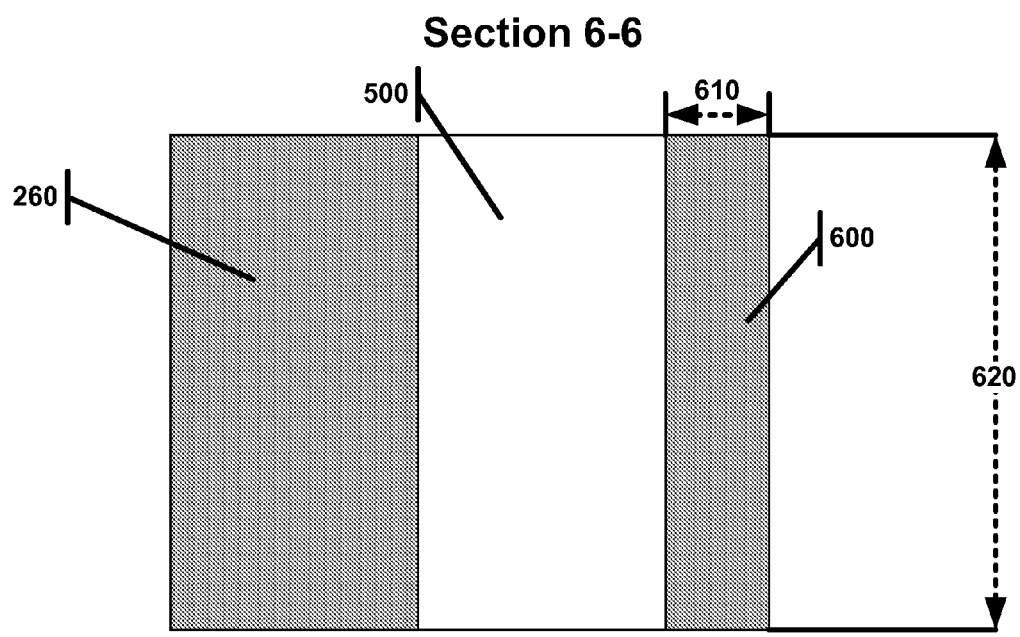
FIG. 6 shows a cross-section of the laterally extending beams of FIGS. 5A and 5B.
Figure 6:
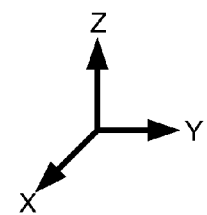

FIGS. 5-8 illustrate an exemplary stiffener plate for a probecard in a microelectronic contactor assembly, configured to resist "z" direction thermal movement according to some embodiments of the invention. (As used herein, movement includes movement, deformation, bending, warping, etc.) As best shown in FIGS. 5A, 5B and FIG. 6, provided are example laterally extending (i.e., extending generally in the "x-y" plane) stiffener plates 210', 210", modified by forming through holes or slots 500 having lengths 510 near the outer periphery of the main bodies 260 of the stiffener plates 210', 210" adjacent or otherwise near mounting points 250. The holes or slots 500 are formed so as to create or result in beams 600 that connect the main body 260 to the mounting points 250, for instance at connection regions 630. As shown in FIG. 6, the resulting beams 600 each define a cross-section having base or width 610, and a height or thickness 620. By proper selection of materials, as well as length 510, base 610 and height 620 dimensions, beams 600 can provide a relatively flexible connection of the mounting points 250 to the main body 260. For example, in one non-limiting embodiment, stiffener plates 210' or 210" are formed from 304 Stainless Steel, and the through holes or slots 500 each have an overall arc length 510 of approximately 150 mm (centered about mounting points 250) and are formed to create beams 600 on either side of mounting points 250, the beams having base 610 and height 620 dimensions of 3 mm and 27 mm, respectively. The goal is for the beams 600 to provide connections of the mounting points 250 to the main body 260 that are relatively flexible in the lateral ("x-y") direction (for instance in the radial, or "y" direction for the mounting points 250 shown in FIGS. 5A and 5B), while remaining relatively rigid and non-flexible in the direction normal to the lateral direction (i.e., remaining dimensionally stable in the "z" direction). This allows the main body 260 of the stiffener plates 210', 210" to thermally expand or contract relative to mounting points 250 with significantly less bowing or warpage, because the relative movement is largely absorbed by lateral bending or flexure of the beams 600. In other words, in various embodiments the beams 600 may act essentially like radially-oriented leaf springs suspending the main body 260 within the mounting points 250. Beams 600 are preferably adapted to not strain plastically during normal use, but rather to deflect within the elastic range of the selected material, as will be apparent to persons of skill in the art.

While the example beams 600 shown are formed by a slot 500 resulting in a rectangular cross section having width 610 and height 620, any suitable shape or form of beam(s) that accomplishes the stated goal can be used. For example, the mounting points 250 could be located anywhere within or outside the main body 260, as long as the mounting points 250 are connected to the main body by one or more beams 600 that function according to the principles of the present invention. Appropriate beam geometries may be selected in part by comparing the section modulus of the cross section of the beam 600 in the lateral direction, for instance in the radial or "y" direction as shown in FIGS. 5A and 5B, to the section modulus of the cross section of the beam 600 in the direction normal to the lateral direction (i.e., in the "z" direction). For a rectangular cross-section, the section modulus in the "z" direction is a function of the width 610 of the base and the height 620 of the thickness, according to the following formula: section modulus in the "z" direction ("Sz") is equal to the quantity of the width 610 multiplied by the square of the height 620, all divided by six. Similarly, the section modulus in the "x-y" direction for a rectangular cross section is a function of the width 610 of the base and the height 620 of the thickness, according to the following formula: section modulus in the "x-y" direction ("Sx-y") is equal to the quantity of the height 620 multiplied by the square of the width 610, all divided by six. The respective section moduli of any other shapes may be readily calculated by persons of skill in the art. To provide a beam 600 that is substantially stiffer in the "z" direction than in the lateral ("x-y") direction, the section modulus in the "z" direction should be substantially larger than the section modulus in the lateral ("x-y") direction. For example, in certain embodiments, the laterally extending beams 600 may have a section modulus normal to the lateral direction that is alternatively at least sixteen, twenty-five, thirty-six, forty-nine, sixty-four, eighty-one, one-hundred, or more times greater than in the lateral direction. This may be accomplished in the present example by having heights 620 that are four, five, six, seven, eight, nine, and times larger than corresponding widths 610, respectively. Other ratios may be used as appropriate.

Stiffeners utilizing beams 600 according to any embodiment of the present invention may be incorporated in microelectronic contactor assemblies (probe cards), like that shown and described with respect to FIG. 2, for instance.

Thermal Effects on Exemplary Improved Stiffener Plates

As depicted in FIGS. 7 and 8, adding example slots 500 to stiffener plates 210', 210" to create the example laterally extending beams 600 allows the main body 260 of the example stiffener plates 210', 210" to thermally expand or contract relative to mounting points 250 with significantly less bowing or warpage, because the relative movement is largely absorbed by lateral bending or flexure of the beams 600. Specifically, FIG. 7 shows example stiffening plate 210' with holes or slots 500 added to create beams 600 as described above. When exposed to the same thermal stress (i.e., 60 degree Celsius temperature increase) computer models predict that the stiffener 210' would deflect in the "z" direction (i.e., normal to the laterally extending stiffener plate 210') according to the gray scale shown in FIG. 7, with the lightest colors once again representing the most deflection. As expected the most deflection is still in the center region 720, but unlike the previous version of stiffener plate 210' without the slots 500, the "z" deflection is distributed much more evenly and the magnitudes of these deflections are much smaller. Specifically, shaded area 720 has a deflection of about 9.0 e-5 meters, which is just 38% of the deflection predicted without the holes or slots 500 that created beams 600. Additionally, dashed line 730 indicates deflection of about 6.0 e-5 meters, and dashed line 740 a deflection of 3.0 e-5 meters.

FIG. 8 shows example stiffening plate 210" (which has weight and thermal mass reducing holes 405) with holes or slots 500 added to create beams 600 as described above. When exposed to the same thermal stress (i.e., 60 degree Celsius temperature increase) computer models predict that the stiffener 210" would deflect in the "z" direction (i.e., normal to the laterally extending stiffener plate 210") according to the gray scale shown in FIG. 8, with the lightest colors again representing the most deflection. Once again, as expected the most deflection is still in the center region 820, but unlike the previous version of stiffener plate 210" without the slots 500, the "z" deflection is distributed much more evenly and the magnitudes of these deflections are much smaller. Specifically, the shaded area 820 has a deflection of about 9.0 e-5 meters, which is only about one-third of the deflection indicated without the holes or slots 500 that created beams 600. Moving away from the center, dashed line 830 indicates a deflection of about 6.0 e-5 meters, and dashed line 840 a deflection of about 3.0 e-5 meters.

The magnitude of predicted reductions in thermally-induced "z" deflections are significant, and are expected to largely avoid the real-world thermal distortion problems associated with typical stiffeners. By avoiding the problems associated with typical stiffeners, the present system can utilize a stiffener 210 formed from a material with a high coefficient of thermal expansion ("CTE"), so that the stiffener 210 can expand similarly in the "x" and "y" directions to the thermally expansive and/or highly-heated components attached with fasteners 214 to the stiffener 210, such as the probe head 202, the compressible electrical interconnect 204, and/or the circuit board 206. The stiffener 210 may be formed from a material that has significantly different mechanical properties (such as, for instance, CTE, heat capacity, thermal conductivity, strength, stiffness, etc.) from other components with which the stiffener 210 interfaces, such as, for example, prober 102 and/or test head 104 of FIGS. 1A and 1B. In one embodiment the stiffener 210 is formed from relatively high CTE material, such as, for instance, Grade 303 Stainless Steel, T6061 Aluminum, or even a suitable polymer or other material.

It should be apparent that the materials and geometries of stiffener 210 should be selected to have sufficient strength. For example, in various embodiments the stiffener 210 may comprise metal (e.g., aluminum), which is typically stronger and more resistant to movement, bowing, warping, etc. than a circuit board 206 would be (e.g., as discussed above, the circuit board 206 is typically made of printed circuit board materials). Other non-limiting examples of materials from which the stiffener 210 can be made include Grade 416 Stainless Steel, Grade 316 Stainless Steel, Aluminum and Aluminum alloys (such as, for instance, 7071, 3000, 5056 etc.), Titanium, Kovar, Invar steel, titanium, nickel, graphite epoxy, metal matrix materials, ceramics, etc. In addition, alloys of any of the foregoing materials or mixtures of any of the foregoing materials with other materials can be used. It should be apparent that the stiffener 210 can form part of a metallic structure that attaches the probe head assembly 202 to the prober head plate 121. Materials for the components of assembly 200 are selected to take advantage of thermally-induced (thermal gradient and/or differential CTE) deformation to produce optimal planarity of contactor tips or probes 220 at a desired temperature.

Although exemplary embodiments and applications of the invention have been described herein, there is no intention that the invention be limited to these exemplary embodiments and applications or to the manner in which the exemplary embodiments and applications operate or are described herein. Indeed, many variations and modifications to the exemplary embodiments are possible. For example, although each of the embodiments is described herein in the context of testing semiconductor dies, the invention is not so limited but is applicable to any apparatus, system, or scenario in which a device is tested or monitored by probing the device.

The invention claimed is:

1. A laterally extending stiffener plate adapted to provide stiffening for a probecard, comprising:
   a main body; and
   a plurality of mounting points;
   wherein at least one of the mounting points is flexibly connected to the main body by one or more laterally extending beams connected to the main body at a connection region that comprises a slot; the slot constructed such that the one or more beams has a section modulus normal to the lateral direction at least sixteen times greater than a section modulus in the lateral direction.

2. The laterally extending stiffener plate of claim 1, wherein the one or more laterally extending beams has a section modulus normal to the lateral direction at least twenty-five times greater than in the lateral direction.

3. The laterally extending stiffener plate of claim 1, wherein the one or more laterally extending beams has a section modulus normal to the lateral direction at least thirty-six times greater than in the lateral direction.

4. The laterally extending stiffener plate of claim 1, wherein the one or more laterally extending beams has a section modulus normal to the lateral direction at least forty-nine times greater than in the lateral direction.

5. The laterally extending stiffener plate of claim 1, wherein the one or more laterally extending beams has a section modulus normal to the lateral direction at least sixty-four times greater than in the lateral direction.

6. The laterally extending stiffener plate of claim 1, wherein the one or more laterally extending beams has a section modulus normal to the lateral direction at least eighty-one times greater than in the lateral direction.

7. The laterally extending stiffener plate of claim 1, wherein the one or more laterally extending beams has a section modulus normal to the lateral direction at least one-hundred times greater than in the lateral direction.

8. A microelectronic contactor assembly, comprising:
   a probe head comprising a plurality of microelectronic contactors for contacting terminals of semiconductor devices to test the semiconductor devices, the plurality of microelectronic contactors being attached to the probe head;
   a laterally extending stiffener for providing mechanical support to the microelectronic contactors and for connecting the microelectronic contactor assembly to a prober machine, the stiffener comprising a main body and a plurality of mounting points, wherein at least one of the mounting points is flexibly connected to the main body by one or more laterally extending beams connected to the main body at a connection region that comprises a slot; the slot constructed such that the one or more beams has a section modulus normal to the lateral direction at least sixteen times greater than a section modulus in the lateral direction;
   the probe head being attached to the main body of the stiffener; and
   the stiffener being adapted to be attached to the prober machine at the mounting points.

9. The microelectronic contactor assembly of claim 8, further comprising:
   a circuit board disposed between the probe head and the stiffener.

10. The microelectronic contactor assembly of claim 8, further comprising:
    a circuit board disposed between the probe head and the stiffener; and
    a compressible electrical interconnect disposed between the probe head and the circuit board, the compressible electrical interconnect providing electrical interconnections between the probe head and the circuit board.

11. The microelectronic contactor assembly of claim 8, wherein the one or more laterally extending beams has a section modulus normal to the lateral direction at least twenty-five times greater than in the lateral direction.

12. The microelectronic contactor assembly of claim 8, wherein the one or more laterally extending beams has a section modulus normal to the lateral direction at least thirty-six times greater than in the lateral direction.

13. The microelectronic contactor assembly of claim 8, wherein the one or more laterally extending beams has a section modulus normal to the lateral direction at least forty-nine times greater than in the lateral direction.

14. The microelectronic contactor assembly of claim 8, wherein the one or more laterally extending beams has a section modulus normal to the lateral direction at least sixty-four times greater than in the lateral direction.

15. The microelectronic contactor assembly of claim 8, wherein the one or more laterally extending beams has a section modulus normal to the lateral direction at least eighty-one times greater than in the lateral direction.

16. The microelectronic contactor assembly of claim 8, wherein the one or more laterally extending beams has a section modulus normal to the lateral direction at least one-hundred times greater than in the lateral direction.

17. A method of maintaining contact between a plurality of microelectronic contactors and terminals of semiconductor devices, the method comprising:
   coupling a probe card assembly to a prober machine for testing semiconductor devices, the probe card assembly comprising:
   a plurality of microelectronic contactors for contacting terminals of semiconductor devices to test the semiconductor devices, the plurality of microelectronic contactors being attached to a probe head;
   a laterally extending stiffener for providing mechanical support to the microelectronic contactors and for connecting the probe card assembly to a prober machine, the stiffener comprising a main body and a plurality of mounting points, wherein at least one of the mounting points is flexibly connected to the main body by one or more laterally extending beams connected to the main body at a connection region that comprises a slot; the slot constructed such that the one or more beams has a section modulus normal to the lateral direction at least sixteen times greater than a section modulus in the lateral direction;
   the probe head being attached to the main body of the stiffener;
   the stiffener being attached to the prober machine at the mounting points; causing the probe head and the main body of the stiffener to which the probe head is attached to laterally expand or contract thermally relative to the mounting points, so that the ones of the probes and the ones of the terminals of the semiconductor devices maintain sufficient alignment to maintain said contact as the semiconductor devices expand or contract thermally.

18. The method of claim 17, wherein the one or more laterally extending beams has a section modulus normal to the lateral direction at least thirty-six times greater than in the lateral direction.

19. The method of claim 17, wherein the one or more laterally extending beams has a section modulus normal to the lateral direction at least sixty-four times greater than in the lateral direction.

20. The method of claim 17, wherein the one or more laterally extending beams has a section modulus normal to the lateral direction at least one-hundred times greater than in the lateral direction.

* * * * *